United States Patent [19]
Murakami et al.

[11] Patent Number: 6,074,289
[45] Date of Patent: Jun. 13, 2000

[54] APPARATUS FOR HOLDING SUBSTRATE TO BE POLISHED

[75] Inventors: Tomoyasu Murakami; Mikio Nishio; Mitsunari Satake, all of Osaka, Japan

[73] Assignee: Matsushita Electric Industrial Co., Ltd., Osaka, Japan

[21] Appl. No.: 08/991,640

[22] Filed: Dec. 16, 1997

[30] Foreign Application Priority Data

Dec. 17, 1996 [JP] Japan ................................. 8-337057

[51] Int. Cl.[7] .................................................. B24B 7/22
[52] U.S. Cl. ............................................ 451/388; 451/288
[58] Field of Search ................................. 451/398, 388, 451/288, 287, 41

[56] References Cited

U.S. PATENT DOCUMENTS

| 5,635,083 | 6/1997 | Breivogel et al. | 451/289 |
| 5,645,474 | 7/1997 | Kubo et al. | 451/288 |
| 5,791,973 | 8/1998 | Nishio | 451/41 |

FOREIGN PATENT DOCUMENTS

| 1188265 | 7/1989 | Japan | 451/364 |
| 6000763 | 1/1994 | Japan | 451/290 |

*Primary Examiner*—Robert Rose
*Attorney, Agent, or Firm*—McDermott, Will & Emery

[57] ABSTRACT

An apparatus for holding a substrate to be polished comprises: a rotating rotary shaft; a substrate holding head in the form of a disc; a sealing member provided to the back face of the substrate holding head; a guiding member which is provided to the back face of the substrate holding head to be located outside the sealing member; and a fluid flow path which vertically penetrates the inside of the substrate holding head. The fluid flow path allows an air under pressure introduced from the upper end side thereof to flow out through the opening at the lower end thereof to a space. The sealing member is formed with a ventilation body having a large number of successive vent openings in the inside such as nonwoven fabric.

11 Claims, 9 Drawing Sheets

APPARATUS FOR HOLDING SUBSTRATE TO BE POLISHED

BACKGROUND OF THE INVENTION

The present invention relates to an apparatus for holding a substrate to be polished for use in chemical mechanical polishing (CMP) to flatten the surface of a semiconductor substrate or a liquid-crystal substrate. More particularly, it relates to an apparatus for holding a substrate to be polished whereby the substrate is held and the held substrate is pressed against a polishing pad.

From the 1990s, as semiconductor and liquid-crystal substrates processed by CMP technology have had larger diameters on the order of 10 cm or more, there have been increasing tendencies toward single-wafer polishing. In the case of polishing a semiconductor substrate, in particular, equal polishing should be performed with respect to the entire surface thereof since a design rule of 0.5 $\mu$m or less has been used to define extremely small lines and spaces on the semiconductor substrate.

Below, a description will be given to an apparatus for polishing a substrate in which a conventional apparatus for holding the substrate to be polished is employed with reference to the drawings.

FIG. 6 schematically shows the structure of the conventional apparatus for polishing a substrate, in which is shown a table 101 including: a pad table 101a having a flat surface which is made of a rigid member; a rotary shaft 101b extending downwardly from the back face of the pad table 101a; and rotating means (not shown) for rotating the rotary shaft 101b. To the top surface of the pad table 101a of the table 101 is adhered an elastic polishing pad 102. Above the polishing pad 102 is provided a substrate holding head 104 which holds and rotates a substrate 103. The substrate 103 is pressed against the polishing pad 102 while being rotated by the substrate holding head 104. Abrasive slurry 105 in a prescribed amount is supplied dropwise from an abrasive supply pipe 106 onto the polishing pad 102.

In the polishing apparatus thus constituted, the table 101 is rotated to rotate the polishing pad 102, while the abrasive slurry 105 is supplied onto the polishing pad 102, during which the substrate 103 held by the substrate holding head 104 is pressed against the rotating polishing pad 102 so that a surface of the substrate 103 is polished under pressure and at a relative speed.

In this process, if the surface of the substrate 103 being polished is rugged, the polishing of the protruding portions thereof is enhanced since their contact pressure with the polishing pad 102 is high. On the other hand, the polishing of the recessed portions thereof is inhibited since their contact pressure with the polishing pad 102 is low. Consequently, the surface of the substrate 103 to be polished becomes less rugged and more smooth. This polishing technology is introduced in, for example, "Monthly, Semiconductor World" p.p.,58 to 59, in "Solid State Technology" July, 1992/ the Japanese version, p.p.,2 to 37, and the like.

In the above conventional polishing apparatus, there has been a problem as follows: the substrate 103 held by the substrate holding head 104 is pressed against the polishing pad 102 with an equal force. However, if the pad table 101a of the table 101 has a warped surface and the polishing pad 102 is elastically deformed, or if the thickness of the substrate 103 has variations, the contacting force between the substrate 103 and the polishing pad 102 is not equal but differs from one portion to another within the surface of the substrate 103, resulting in an unequal amount of polishing with respect to the substrate 103.

Then, as shown in FIG. 7, there has been considered an apparatus for holding a substrate to be polished which comprises: a substrate holding head 111 having a fluid supply path 111a which allows a fluid under pressure having flown from one end thereof to flow out of an outlet port at the other end thereof; an annular sealing member 112 made of an elastic material fasten to the peripheral portion of the back face of the substrate holding head 111; and a guiding member 113 fixed outside the annular sealing member 112 at the underside of the substrate holding head 111. According to the apparatus for holding a substrate to be polished, a fluid under pressure introduced form one end of the fluid supply path 111a is supplied from the outlet port to a space 114. Thus, the pressing force of the fluid under pressure supplied to the space 114 presses the substrate 103 to be polished from its upper face against the polishing pad 102. This results in the pressing of the substrate 103 to be polished against the pressing pad 103 with an equal pressing force within the surface of the substrate 103.

However, in the above apparatus for holding a substrate to be polished, the fluid under pressure supplied to the space 114 flows to the outside from the space 114 defined by the substrate holding head 111, annular sealing member 112, and the substrate 103 through the clearance between the annular sealing member 112 and the substrate 103. When an air under pressure flows out, there has arisen a new problem as follows:

First, the equal pressing with respect to the substrate 103 to be polished cannot be performed, resulting in unequal polishing with respect to the surface of the substrate 103. That is, the air under pressure supplied to the space 114 does not flow out from the clearance between the annular sealing member 112 and the substrate 103 evenly in the circumferential direction, but flows out from the discharge part 115 which is a part of the clearance between the annular sealing member 112 and the substrate 103 as shown in FIG. 8. In FIG. 8, the substrate 103 to be polished is shown larger in thickness than actual thickness for convenience in showing the drawing. Therefore, in the region, in the space 114, in proximity to the discharge part 115, which is a part of the above clearance, from which the air under pressure flows out, the pressure of the air approaches atmospheric pressure (the pressure of the air reduces), and hence the pressure exerted on the substrate 103 to press it reduces as compared with the region from which the air under pressure does not flow out. Accordingly, it becomes impossible to press the substrate 103 to be polished with an equal force.

Secondly, in the course of polishing, there has arisen a problem that the substrate 103 to be polished thrusts out of the substrate holding head 111. That is, the substrate holding head 111 rotates and the air under pressure flows out of the discharge part 115 which is a part of the clearance between the annular sealing member 112 and the substrate 103 to be polished, and hence the substrate holding head 111 vertically vibrates. The substrate 103 to be polished is also subjected to a frictional force from the polishing pad 102, and hence the substrate 103 to be polished is not allowed to rotate at the same rate as that of the substrate holding head 111. These two phenomena causes the substrate 103 to be polished to thrust out of the substrate holding head 111.

SUMMARY OF THE INVENTION

The present invention has been achieved in view of the foregoing. It is therefore an object of the present invention to enable the pressing of a substrate to be polished against a polishing pad with an equal pressing force, and prevent the substrate from thrusting out of a substrate holding head in the course of polishing when a fluid under pressure is supplied into the space defined by the substrate holding head, the annular sealing member, and the substrate to be polished disposed on a polishing pad, and the substrate is pressed against the polishing pad to be polished.

In order to achieve the foregoing objects, the present invention is characterized in that the fluid under pressure supplied into the space defined by the substrate holing head, the annular sealing member and the substrate to be polished is allowed to disperse in the circumferential direction through a vent opening to the outside, and to flow out in a small amount at a time.

A first apparatus for holding a substrate to be polished according to the present invention is for holding the substrate and pressing the held substrate against a polishing pad, the above apparatus comprising: a substrate holding head which can move toward and away from the polishing pad, the substrate holding head having substrate holding means for holding the substrate and a fluid supply path which allows a fluid under pressure having flown from one end of the fluid supply path to flow out from an outlet port at the other end of the fluid supply path; and a sealing member provided to a portion of the substrate holding head which surrounds the outlet port of the fluid supply path, the sealing member defining a space in conjunction with the substrate holding head and the substrate disposed on the polishing pad, wherein the sealing member has a large number of vent openings, the vent openings being formed in the inside of the sealing member or the surface of the sealing member opposite the substrate so as to be successive in the inward and outward directions of the space, and allowing a fluid under pressure supplied to the space from the outlet port of the fluid supply path to flow to the outside of the space.

With the first apparatus for holding a substrate to be polished, the sealing member has a large number of vent openings in the inside of the sealing member or the surface of the sealing member opposite the substrate, the vent openings being successive in the inward and outward directions, and allowing a fluid under pressure supplied to the space to flow to the outside. Accordingly, the fluid under pressure supplied to the space disperses from the circumference of the annular sealing member through a large number of the vent openings to flow to the outside in a small amount at a time. Therefore, the substrate to be polished is pressed with an equal pressing force by the fulid under pressure, and the substrate holding head does not vibrate. This prevents the substrate to be polished from thrusting out of the substrate holding head, which enables the steady polishing.

In the first apparatus for holding a substrate to be polished, it is preferable that the sealing member has a ventilation body which consists of a nonwoven fabric, polyurethane foam, or foam rubber.

When the ventilation body of the sealing member is formed with a nonwoven fabric, the working of the vent opening is easy. On the other hand, when the ventilation body is formed with polyurethane foam or foam rubber, it is excellent in chemical resistance, resulting in longer product life of the sealing member. In addition, the ventilation body has excellent elasticity, and hence the fluid under pressure can be sealed in the space with reliability, which enables the pressing of the substrate to be polished against the polishing pad with an equal pressing force.

In the first apparatus for holding a substrate to be polished, it is preferable that the sealing member has a ventilation body which consists of a nonwoven fabric, polyurethane foam, or foam rubber; and an abrasive slurry unpermeable layer which is provided at the surface of the ventilation body opposite the substrate to be polished, and prevents abrasive slurry supplied onto the polishing pad from penetrating into the ventilation body.

With the arrangement, the abrasive slurry supplied onto the polishing pad is not penetrated into the vent openings of the ventilation body, which enables the prevention of the situation where the permeability of the ventilation body is impaired.

In the first apparatus for holding a substrate to be polished, it is preferable that the sealing member has a sheet-like ventilation body having a large number of the vent openings in the inside of the sealing member, or the surface of the sealing member opposite the substrate to be polished; and a holding body being provided integrally with the ventilation body and for holding the ventilation body. With the arrangement, selection of the materials for the holding body can impart the desired characteristics to the sealing member.

When the sealing member has a sheet-like ventilation body and a holding body, it is preferable that the sheet-like ventilation body consists of a nonwoven fabric, polyurethane foam, or foam rubber. With the arrangement, it becomes easy to manufacture the sealing member, and the life of the sealing member is increased.

When the sealing member has a sheet-like ventilation body and a holding body, it is preferable that the holding body is composed of an elastic member. With the arrangement, variations in amount of protruding of the substrate to be polished can be absorbed. When polyurethane or rubber is used as an elastic member, it becomes difficult for the thickness of the holding body to vary. On the other hand, when a low elastic material is used as an elastic member, the amount of variations in thickness that the low elastic material can absorb is large. Accordingly, even if the variations in amount of protruding of the substrate to be polished are large, the variations in amount of protruding thereof can be absorbed with reliability.

When the sealing member has a sheet-like ventilation body and a holding body for holding the ventilation body, it is preferable that the holding body is composed of a rigid member. With the arrangement, the long-term variations in overall thickness of the sealing member can be reduced.

A second apparatus for holding a substrate to be polished according to the present invention is for holding the substrate and pressing the held substrate against a polishing pad, the above apparatus comprising: a substrate holding head which can move toward and away from the polishing pad, the substrate holding head having substrate holding means for holding the substrate and a fluid supply path which allows a fluid under pressure having flown from one end of the fluid supply path to flow out from an outlet port at the other end of the fluid supply path; and a sealing member fastened to a portion of the substrate holding head which surrounds the outlet port of the fluid supply path, the sealing member defining a space in conjunction with the substrate holding head and the substrate disposed on the polishing pad, wherein the substrate holding head has a vent opening, the vent opening being formed in the inside of the substrate holding head so as to be successive in the inward and outward directions thereof, and allowing a fluid under pressure supplied from the outlet port of the fluid supply path to the space to flow to the outside of the space.

With the second apparatus for holding a substrate to be polished, the substrate holding head has the vent opening in the inside thereof, the vent opening being successive in the inward and outward directions thereof, and allowing the fluid under pressure supplied to the space to flow to the outside. Therefore, the fluid under pressure supplied into the space disperses in the circumferential direction of the substrate holding head through the vent opening to flow to the outside in a small amount at a time. Accordingly, the substrate is pressed with an equal pressing force by the air under pressure, and the substrate holding head does not vibrate. Consequently, the substrate to be polished will not thrust out of the substrate holding head, enabling the steady polishing. Also, the fluid under pressure which has flown out will not scatter abrasive slurry, and hence abrasive slurry can be supplied onto the surface to be polished of the substrate with stability.

In the second apparatus for holding a substrate to be polished, it is preferable that at least a part of the substrate holding head is formed with a nonwoven fabric, porous glass, or porous stone. With the arrangement, it becomes easy to manufacture the substrate holding head having the vent opening.

DETAILED DESCRIPTION OF THE INVENTION

Below, a description will be given to an apparatus for polishing a substrate in which an apparatus for holding a substrate to be polished according to first and second embodiments of the present invention with reference to the drawings.

Figure 1:
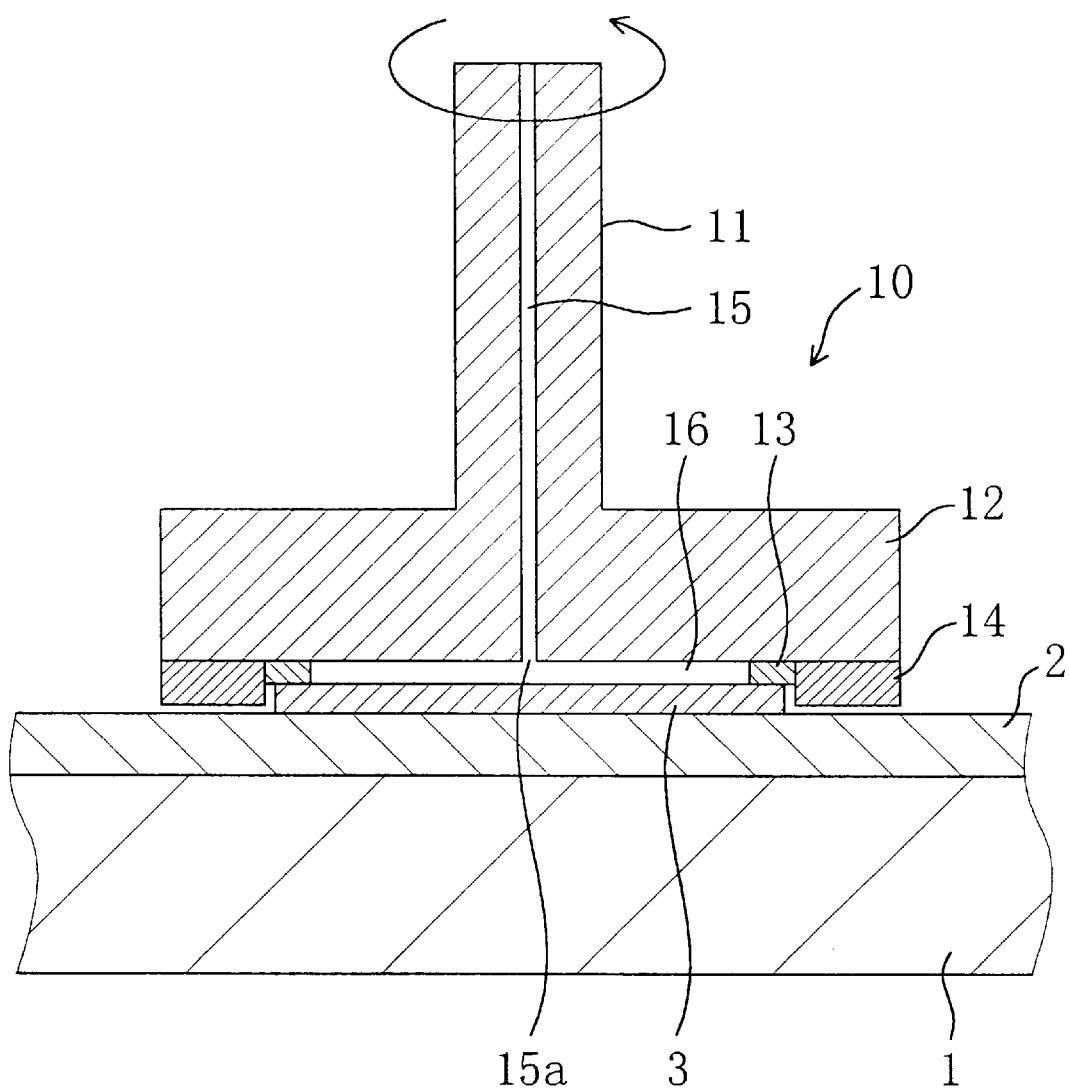
FIG. 1 is a schematic cross-sectional view of an apparatus for polishing a substrate in which an apparatus for holding a substrate to be polished according to a first embodiment of the present invention is used.

FIG. 1 schematically shows the cross section of the structure of the above apparatus for polishing a substrate, in which are shown: a rotatable table 1 having a flat surface which is made of a rigid member; to the top surface of the table 1 is adhered an elastic polishing pad 2; and above the polishing pad 2 is provided a substrate holding apparatus 10 for holding a substrate 3 to be polished.

The substrate holding apparatus 10 for holding a substrate to be polished includes: a rotary shaft 11 rotated by rotary driving means (not shown); a substrate holding head 12 in the from of a disc which is provided integrally on the lower edge of the rotary shaft 11; an annular sealing member 13 fastened to the peripheral portion of the back face of the substrate holding head 12; an annular guiding member 14 which is fastened to the back face of the substrate holding head 12 outside the annular sealing member 13; and a fluid flow path 15 provided so as to vertically penetrating through the inside of the substrate holding head 12. The fluid flow path 15 allows a fluid under pressure, for example, air under pressure which flows in from one end thereof (upper end in FIG. 1) to flow out from an opening 15a at the other end thereof (lower end in FIG. 1), and allows the air under the substrate holding head 12 to be sucked through the opening 15a and flow out from one end thereof.

(First embodiment)

A first embodiment is characterized in that the annular sealing member 13 has a large number of vent openings formed so as to be successive in the inward and outward directions in the inside thereof, or the surface thereof opposite the substrate 3 to be polished. Below, the construction of the annular sealing member 13 will be described with reference to the drawings.

Figure 4A:
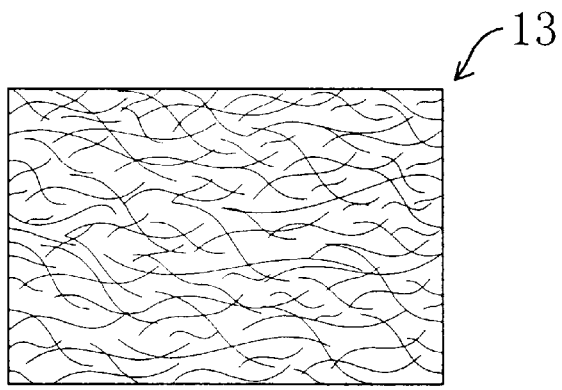
FIG. 4(a) is a partial cross-sectional view of a first annular sealing member in the apparatus for holding a substrate to be polished according to the first embodiment.

FIG. 4(a) shows a first concrete example of the annular sealing member 13, which is constituted of a ventilation body made of a nonwoven fabric.

Figure 4B:
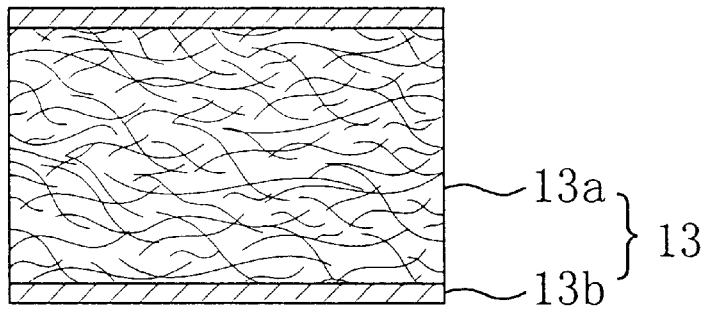
FIG. 4(b) is a partial cross-sectional view of a second annular sealing member in the apparatus for holding a substrate to be polished according to the first embodiment.

FIG. 4(b) shows a second concrete example of the annular sealing member 13, which is constituted of: a ventilation body 13a made of a nonwoven fabric; and an abrasive unpermeable layer 13b provided at least the back face (the surface opposite the substrate 3 to be polished) of the ventilation body 13. As the abrasive unpermeable layer 13b, it may be formed by heat-treating at least the back face of the ventilation body 13a made of a nonwoven fabric, or adhering a film with abrasive non-permeable property to at least the back face of the ventilation body 13a.

Figure 4C:
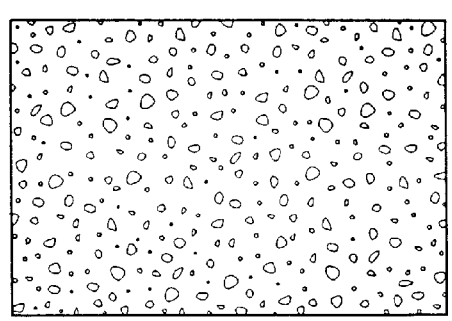
FIG. 4(c) is a partial cross-sectional view of a third annular sealing member in the apparatus for holding a substrate to be polished according to the first embodiment.

FIG. 4(c) shows a third concrete example of the annular sealing member 13, which is made of a ventilation body having a large number of successive vent openings such as polyurethane foam or foam rubber. In this case, as polyurethane foam or foam rubber, it is preferable to have a structure of open cell type. However, even if it has a structure of closed cell type, it is sufficient if it is so constructed that vent openings are substantially successive.

Figure 5A:
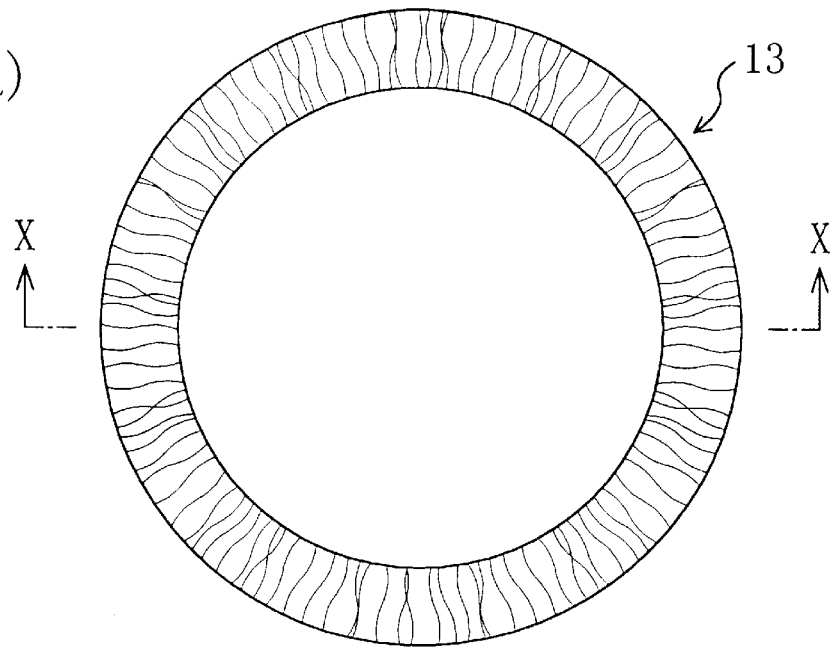
FIG. 5(a) is a plan view of the underside of the first annular sealing member in the apparatus for holding a substrate to be polished according to the first embodiment.
Figure 5B:
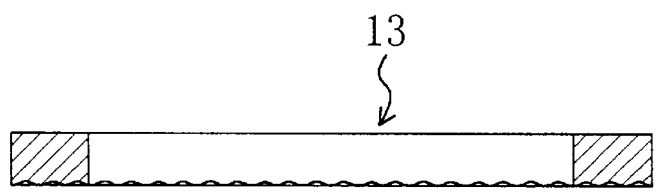
FIG. 5(b) is a cross-sectional view taken on line X—X of FIG. 5(a) and FIG. 5(c) is a partial cross-sectional view of a fifth annular sealing member in the apparatus for holding the semiconductor substrate to be polished according to the first embodiment.

FIGS. 5(a) and 5(b) shows a fourth concrete example of the annular sealing member 13, which is made of, for example, resins such as rigid plastics, and has a large number of vent openings (grooves in the form of hair) at the back face opposite the substrate 3 to be polished. A large number of the vent openings can be formed by, for example, polishing the back face, of rigid plastics in the form of a ring, opposite the substrate 3 to be polished with a coarse whetstone. FIG. 5(a) shows the construction of the back face of the fourth annular sealing member 13, and FIG. 5(b) shows the construction of the cross-section taken on line X—X of FIG. 5(a).

Figure 5C:
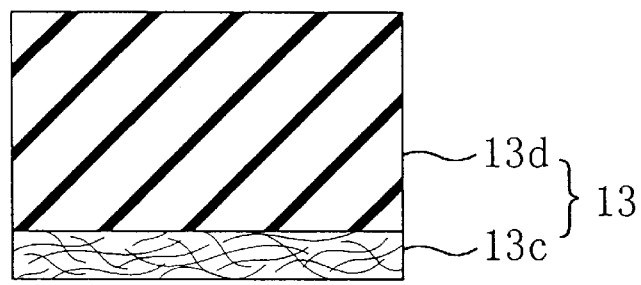
Figure 6:
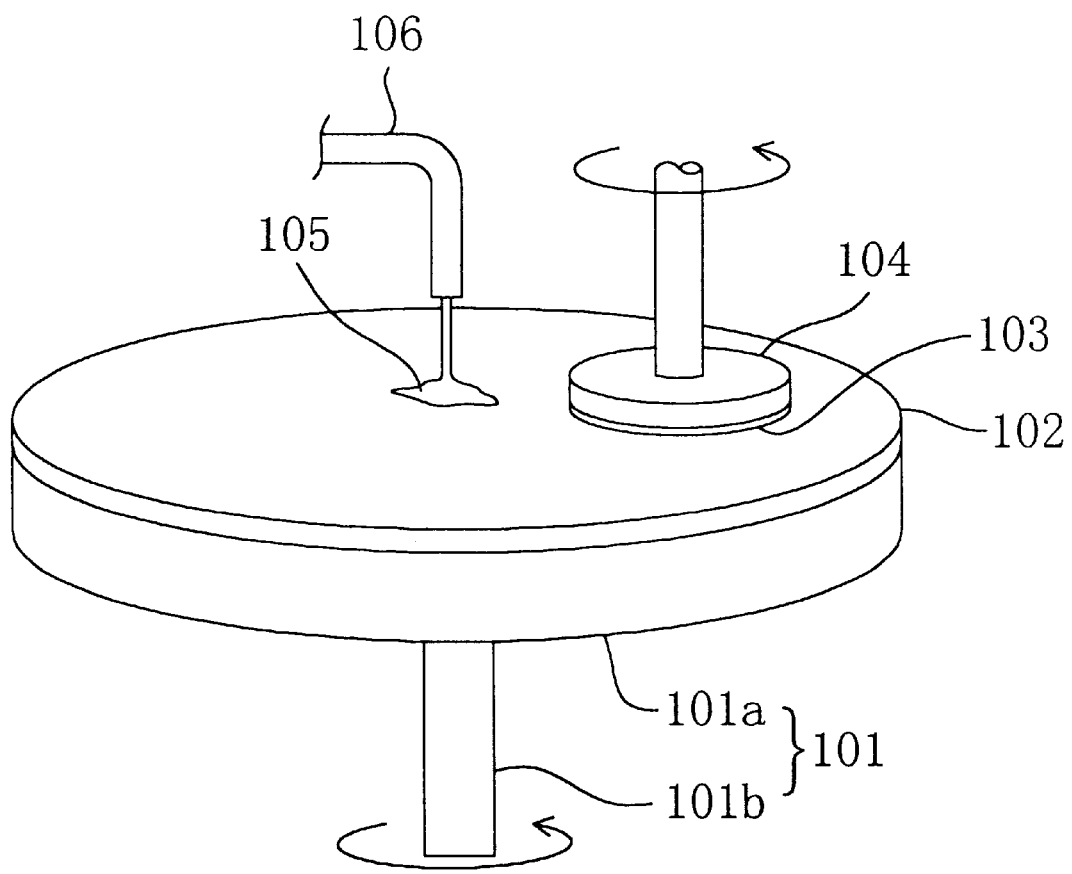
FIG. 6 is a schematic cross-sectional view of a conventional apparatus for polishing a substrate.
Figure 7:
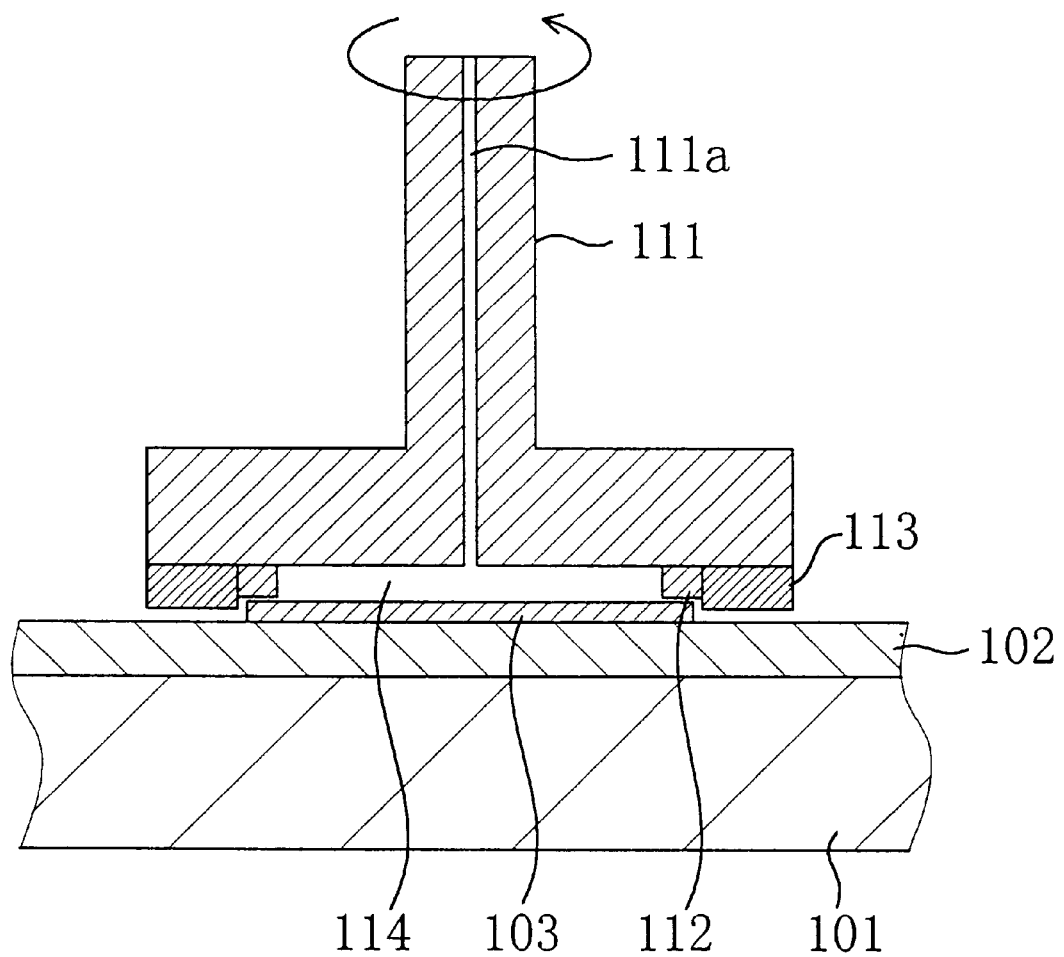
FIG. 7 is a schematic cross-sectional view of an apparatus for holding a substrate to be polished, which corresponds to the premise of the present invention.
Figure 8:
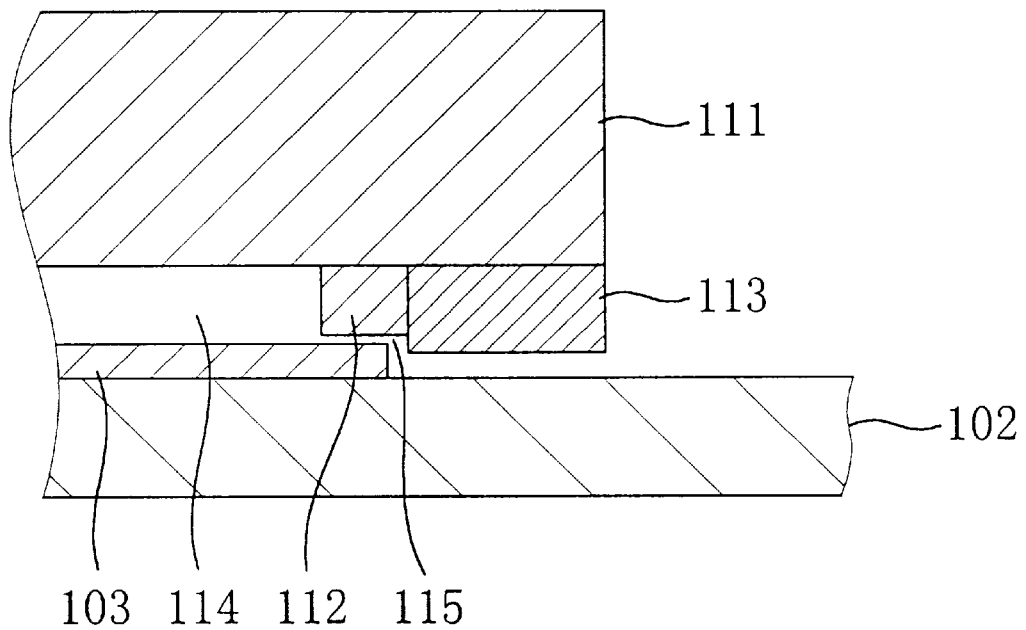
FIG. 8 is a partial cross-sectional view for illustrating the problems of the apparatus for holding a substrate to be polished, which corresponds to the premise of the present invention.

FIG. 5(c) shows a fifth concrete example of the annular sealing member 13, which is constituted of a ventilation body 13c in the form of a sheet, and a holding body 13d formed integrally with the ventilation body 13c and for holding the ventilation body 13c. As materials for the ventilation body 13c, a nonwoven fabric, polyurethane foam, foam rubber, or the like can be used, while as the materials for the holding body 13d, elastic members such as polyurethane, rubber or low elastic materials, a rigid members such as rigid plastics or metals, or the like can be used.

Below, a description will be given to a method of polishing a substrate implemented by means of the apparatus for holding a substrate to be polished according to the first embodiment with reference to FIGS. 1, 2(a), 2(b), and 3.

A description will be given first to a step of holding the substrate 3 to be polished.

Figure 2A:
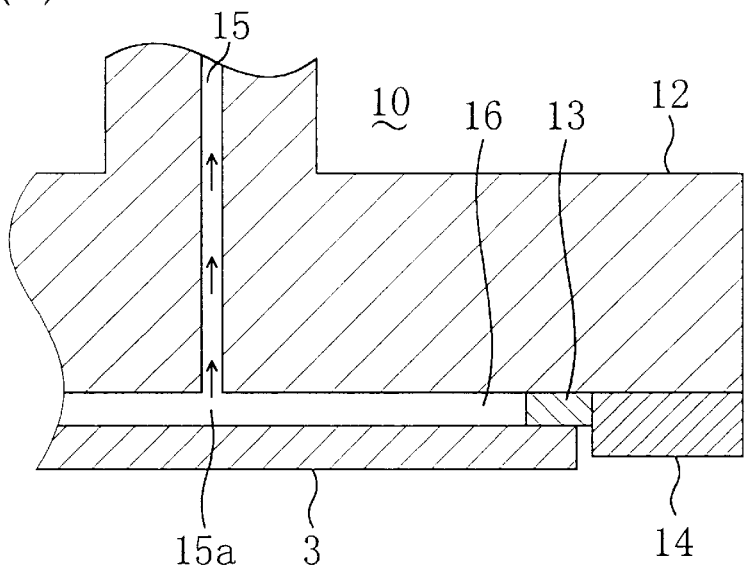
FIGS. 2(a) and 2(b) are partial cross-sectional views showing respective steps of a method for polishing a substrate using the above apparatus for polishing a substrate.

The substrate 3 or substrate holding apparatus 10 is moved horizontally so that the substrate 3 is placed under the substrate holding head 12. The substrate holding head 12 is then moved downward so to be closer to the substrate 3. Subsequently, the air under the substrate holding head 12 is sucked through the opening 15a of the fluid flow path 15 so that the substrate 3 comes in intimate contact with the annular sealing member 13 to be held by the substrate holding head 12, as shown in FIG. 2(a). This results in the formation of a space 16 by the substrate holding head 12, annular sealing member 13, and substrate 3 to be polished.

Next, a description will be given to a step of polishing the substrate 3 to be polished.

Figure 2B:
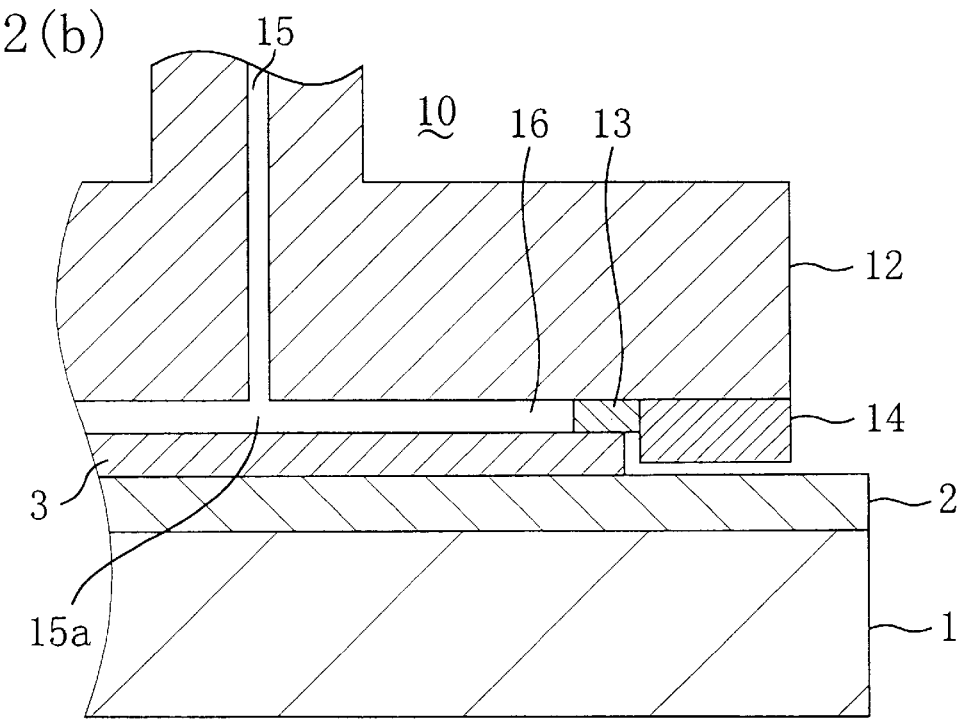
Figure 3:
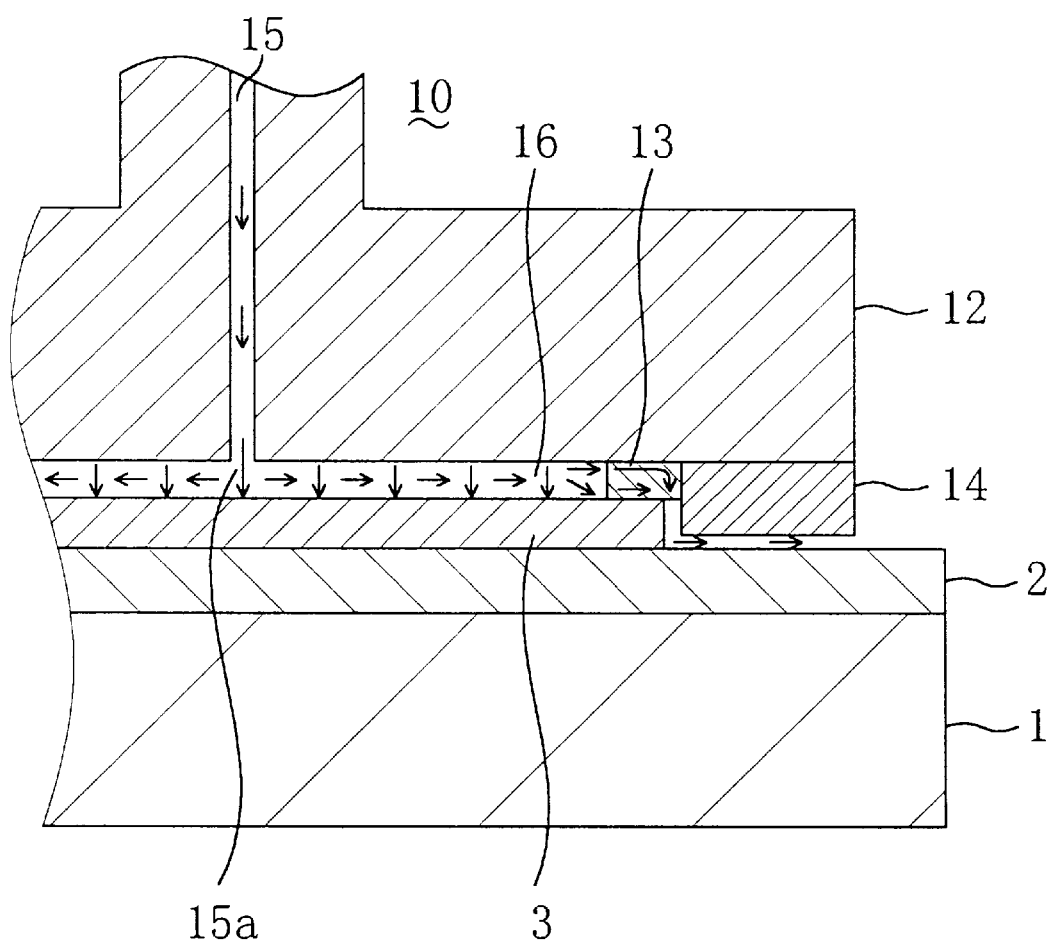
FIG. 3 is a partial cross-sectional view showing a polishing step of the method for polishing a substrate using the above apparatus for polishing a substrate.

The substrate holding head 12 which holds the substrate 3 to be polished is moved downward so that the substrate 3 is closer to the surface of the polishing pad 2. Thereafter, atmospheric pressure is achieved in the fluid flow path 15. With the arrangements, the surface to be polished of the substrate 3 comes in contact with the polishing pad 2 as shown in FIG. 2(b).

Then, an air under pressure is introduced from one end of the fluid flow path 15 to be supplied to the space 16, whereby the substrate 3 to be polished is pressed against the polishing pad 2 under the pressure of the air. In this situation, the polishing pad 2 and substrate holding head 12 on the table 1 are rotated each in a prescribed direction, respectively, while abrasive slurry is supplied onto the polishing pad 2, thereby polishing the substrate 3. In this case, the air under pressure supplied to the space 16 is dispersed in the circumferential direction of the annular sealing member 13 through a large number of vent openings formed in the inside, or the surface opposite the substrate 3 to be polished, of the annular sealing member 13 to flow to the outside in a small amount at a time.

Therefore, the pressure of the air in the space 16 becomes equal, and hence the substrate 3 to be polished is pressed against the polishing pad 2 under an equal pressure of the air. The air under pressure also flows to the outside from a part of the clearance between the annular sealing member 13 and substrate 3 to be polished, which avoids the situation where the substrate holding head 12 vibrates. Accordingly, the substrate 3 to be polished will not thrust out of the substrate holding head 12, enabling the steady polishing thereof.

With the first annular sealing member 13 shown in FIG. 4(a), the annular sealing member 13 can be obtained only by forming a nonwoven fabric, and hence the annular sealing member 13 having vent openings can be manufactured with ease.

With the second annular sealing member 13 shown in FIG. 4(b), an abrasive unpermeable layer 13b is provided at least on the back face of the ventilation body 13a, which can avoid the situation where abrasive slurry is penetrated into the ventilation body 13a made of a nonwoven fabric to impair the permeability of the ventilation body 13a.

With the third annular sealing member 13 shown in FIG. 4(c), polyurethane foam or foam rubber is excellent in chemical resistance with respect to abrasive slurry, resulting in longer product life of the annular sealing member 13.

With the fourth annular sealing member 13 shown in FIGS. 5(a) and 5(b), the annular sealing member 13 can be obtained by polishing the surface, of the annular sealing member formed in ring, opposite the substrate 3 to be polished with a coarse whetstone, resulting in excellent workability and longer product life of the annular sealing member 13.

With the fifth annular sealing member 13 shown in FIG. 5(c), selection of materials for the holding body 13d can impart desired characteristics to the annular sealing member 13. As a material for the holding body 13d, an elastic member such as polyurethane, rubber or low elastic material can be used to absorb variations in amount of protruding of the substrate 3 to be polished. Especially, if a low elastic member is used as the material for the holding body 13d, the amount of variations in thickness that the low elastic material can absorb is large. Accordingly, even if the amount of protruding of the substrate 3 to be polished are large, the variations in amount of protruding thereof can be absorbed with reliability. When the holding body 13d is formed with low elastic materials, it is preferable to perform waterproofing. If the holding body 13d is subjected to waterproofing, it becomes difficult for the holding body 13d to absorb abrasive slurry. Consequently, the change in characteristics of the annular sealing member 13 can be inhibited. When rigid members such as rigid plastics and metals are used as the material for the holding body 13d, long-term change in overall thickness of the annular sealing member 13 can be reduced.

When the annular sealing member 13 is constituted of the ventilation body 13c in the form of a sheet, and the holding body 13d as the fifth annular sealing member, the thickness of the ventilation body 13c is preferably 0.3 mm or less. With the arrangement, even if the ventilation body 13c is formed with a nonwoven fabric, the amount of expansion of the ventilation body 13c is small, and hence the polishing characteristic will not be impaired.

(Second embodiment)

A second embodiment is characterized in that the substrate holding head 12 has a large number of vent openings formed so as to be successive in the inward and outward directions in the inside thereof. Concretely, the substrate holding head 12 is manufactured by forming the ventilation body having a large number of successive vent openings such as nonwoven fabric, polyurethane foam or foam rubber in prescribed shape.

Figure 9:
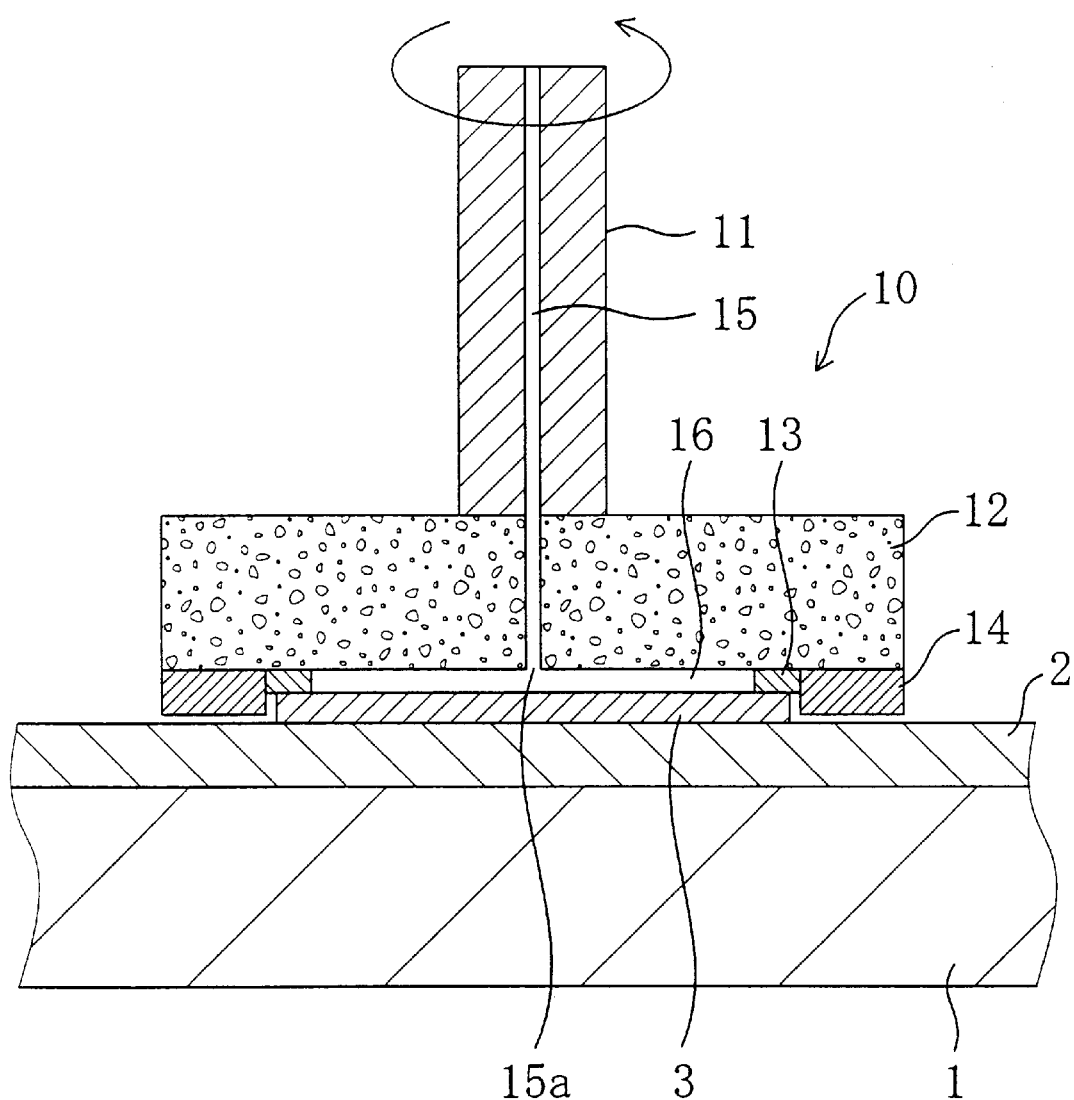
FIG. 9 is a schematic cross-sectional view of an apparatus for polishing a substrate in which an apparatus for holding a substrate to be polished according to a second embodiment of the present invention is used.

Below, a description will be given to a method for polishing a substrate implemented by means of an apparatus for holding a substrate to be polished according to the second embodiment with reference to FIG. 9. However, the description in detail is omitted on the same step as in the method for polishing a substrate implemented by means of the apparatus for holding a substrate to be polished according to the first embodiment.

First, the substrate 3 to be polished is held by the substrate holding head 12, resulting in the formation of a space 16 by the substrate holding head 12, annular sealing member 13, and substrate 3 to be polished. Thereafter, the substrate 3 is made to be closer to the surface of the polishing pad 2, after which an atmospheric pressure is achieved in the inside of the fluid flow path 15. This causes the surface to be polished of the substrate 3 to come into contact with the polishing pad 2.

Next, an air under pressure is introduced from one end of the fluid flow path 15 to be supplied into the space 16, resulting in the pressing of the substrate 3 to be polished against the polishing pad 2 by the pressing force of the air under pressure. In this state, the polishing pad 2 and substrate holding head 12 are caused to rotate each in a prescribed direction, respectively, while abrasive slurry is supplied onto the polishing pad 2 to polish the substrate 3. Then, the air under pressure supplied into the space 16 disperses in the circumferential direction through a large number of vent openings formed in the inside of the substrate holding head 12 to flow to the outside in a small amount at a time. Therefore, the substrate 3 is pressed against the polishing pad 2 with an equal pressure of the air, and the substrate holding head 12 does not vibrate. Accordingly, the substrate 3 to be polished will not thrust out of the substrate holding head 12, enabling the steady polishing.

When the substrate holding head 12 is formed by the use of a nonwoven fabric, porous glass, or porous stone, the manufacturing of the substrate holding head 12 is easy, and the air which has flown out does not scatter abrasive slurry. Therefore, the surface to be polished of the substrate 3 can be supplied with abrasive slurry with stability.

We claim:

1. An apparatus for holding a substrate to be polished and pressing an obverse of the held substrate against a polishing pad, said apparatus comprising:
    a substrate holding head which can move toward and away from said polishing pad, said substrate holding head having substrate holding means for holding the substrate and a fluid supply path which allows a fluid under pressure having flown from one end of said fluid supply path to flow out from an outlet port at the other end of said fluid supply path; and
    an annular sealing member provided to a portion of said substrate holding head which surrounds the outlet port of said fluid supply path, said annular sealing member supporting said substrate only at the outer periphery of said substrate,
    wherein a space is formed by a reverse of the substrate, said substrate holding head and said annular sealing member,
    the obverse of the substrate is pressed against said polishing pad by the fluid under pressure supplied into said space from said outlet port of said fluid supply path, and
    said annular sealing member has a large number of vent openings, said vent openings being formed in the inside of said annular sealing member or the surface of said annular sealing member opposite said substrate so as to be successive in the inward and outward directions of said space, and allowing a fluid under pressure supplied to said space from the outlet port of said fluid supply path to flow to the outside of said space.

2. An apparatus for holding a substrate to be polished according to claim 1, wherein
    said sealing member has a ventilation body which comprises a nonwoven fabric, polyurethane foam, or foam rubber.

3. An apparatus for holding a substrate to be polished according to claim 1, wherein
    said sealing member has a ventilation body which consists of a nonwoven fabric, polyurethane foam, or foam rubber; and an abrasive slurry unpermeable layer which is provided at the surface of said ventilation body opposite said substrate to be polished, and prevents abrasive slurry supplied onto said polishing pad from penetrating into said ventilation body.

4. An apparatus for holding a substrate to be polished according to claim 1, wherein
    said sealing member has a sheet-like ventilation body having a large number of said vent openings in the inside of said sealing member or the surface of said sealing member opposite said substrate to be polished, and a holding body being provided integrally with said ventilation body and for holding said ventilation body.

5. An apparatus for holding a substrate to be polished according to claim 4, wherein
    said ventilation body comprises a nonwoven fabric, polyurethane foam, or foam rubber.

6. An apparatus for holding a substrate to be polished according to claim 4, wherein
    said holding body is composed of an elastic member.

7. An apparatus for holding a substrate to be polished according to claim 6, wherein
    said elastic member consists of polyurethane, rubber, or a low elastic material.

8. An apparatus for holding a substrate to be polished according to claim 4, wherein
    said holding body is composed of a rigid member.

9. An apparatus for holding a substrate to be polished and pressing an obverse of the held substrate against a polishing pad, said apparatus comprising:
    a substrate holding head which can move toward and away from said polishing pad, said substrate holding head having substrate holding means for holding the substrate and a fluid supply path which allows a fluid under pressure having flown from one end of said fluid supply path to flow out from an outlet port at the other end of said fluid supply path; and
    an annular sealing member provided to a portion of said substrate holding head which surrounds the outlet port of said fluid supply path, wherein
        a space is formed by said substrate holding head, a reverse of the substrate and said annular sealing member,
        the obverse of the substrate is pressed against said polishing pad by the fluid under pressure supplied into said space from said outlet port of said fluid supply path, and
        said substrate holding head has a vent opening, said vent opening being formed in the inside of said substrate holding head so as to be successive in the inward and outward directions thereof, and allowing a fluid under pressure supplied from said outlet port of said fluid supply path to said space to flow to the outside of said space.

10. An apparatus for holding a substrate to be polished according to claim 9, wherein
    at least a part of said substrate holding head is formed with a nonwoven fabric, porous glass, or porous stone.

11. An apparatus for holding a substrate to be polished and pressing an obverse of the held substrate against a polishing pad, said apparatus comprising:
    a substrate holding head which can move toward and away from said polishing pad, said substrate holding head having substrate holding means for holding the substrate and a gas supply path which allows a gas under pressure having flown from one end of said gas supply path to flow out from an outlet port at the other end of said gas supply path; and an annular sealing member provided to a portion of said substrate holding head which surrounds the outlet port of said gas supply path, wherein
- a space is formed by a reverse of the substrate, said substrate holding head and said annular sealing member,
- the obverse of the substrate is pressed against said polishing pad by the gas under pressure supplied into said space from said outlet port of said gas supply path, and
- said annular sealing member has a large number of vent openings, said vent openings being formed in the inside of said annular sealing member or the surface of said annular sealing member opposite said substrate so as to be successive in the inward and outward directions of said space, and allowing a gas under pressure supplied to said space from the outlet port of said gas supply path to flow to the outside of said space.

* * * * *